United States Patent
Das et al.

(10) Patent No.: US 10,242,150 B1
(45) Date of Patent: Mar. 26, 2019

(54) CIRCUIT DESIGN IMPLEMENTATION USING CONTROL-SET BASED MERGING AND MODULE-BASED REPLICATION

(71) Applicant: Xilinx, Inc., San Jose, CA (US)

(72) Inventors: Sabyasachi Das, San Jose, CA (US); Xiaojian Yang, Sunnyvale, CA (US); Niyati Shah, San Jose, CA (US); Govinda Keshavdas, San Francisco, CA (US); Frederic Revenu, San Carlos, CA (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 15/175,897

(22) Filed: Jun. 7, 2016

(51) Int. Cl.
*G06F 17/50* (2006.01)

(52) U.S. Cl.
CPC .................... *G06F 17/5081* (2013.01)

(58) Field of Classification Search
CPC .................................................. G06F 17/5081
USPC .............................................................. 716/114
See application file for complete search history.

(56) References Cited

U.S. PATENT DOCUMENTS

| | | | |
|---|---|---|---|
| 7,979,831 B1 | 7/2011 | Srinivasan | |
| 8,161,448 B1* | 4/2012 | Croix | G06F 17/5036 716/136 |
| 2002/0188918 A1* | 12/2002 | Cirit | G06F 17/505 716/113 |
| 2004/0243964 A1* | 12/2004 | McElvain | G06F 17/5031 716/112 |
| 2009/0083681 A1* | 3/2009 | Mccoo | G06F 17/505 716/136 |
| 2014/0258957 A1* | 9/2014 | Jiang | G06F 17/505 716/114 |

OTHER PUBLICATIONS

Altera Corporation, "Quartus II Handbook vol. 2: Design Implementation and Optimization," Chapter 12, "Timing closure and Optimization," version 13.1, pp. 12-1-12-46, QII52005-13.1.0, (Nov. 2013) San Jose, CA USA.
Altera Corporation, "Quartus II Handbook vol. 2: Design Implementation and Optimization," Chapter 16, "Netlist Optimizations and Physical Synthesis," version 13.1, pp. 16-1-16-16, QII52007-13.1.0, (Nov. 2013), San Jose, CA USA.
Chen, Wei, et al., "Simultaneous Gate Sizing and Placement," IEEE Transactions on Computer-Aided Design of Integrated Circuits and Systems, vol. 19, No. 2, pp. 206-214, (Feb. 2000).

(Continued)

*Primary Examiner* — Suchin Parihar
(74) *Attorney, Agent, or Firm* — Kevin T. Cuenot

(57) ABSTRACT

Circuit design implementation can include selecting a first and second load each having a control pin of a same type driven by a different driver, determining whether the driver of the first load matches the driver of the second load, and modifying the circuit design to drive the control pins of the first load and the second load using the driver of the first load. Circuit design implementation can include selecting a net having a driver and a plurality of loads exceeding a threshold, determining a selected module of the circuit design having a number of the plurality of loads of the net that meet a cloning criteria, and, in response, modifying the circuit design by creating a clone of the driver within the selected module and driving each load of the net within the selected module with the clone of the driver.

19 Claims, 6 Drawing Sheets

(56) References Cited

OTHER PUBLICATIONS

Chen, Xun, et al., "Timing-Driven Routing of High Fanout Nets," 21st International Conference on Field Programmable Logic and Applications, pp. 423-428, (2011).
Kashfi et al., "Multi-Objective Optimization Techniques for VLSI Circuits," 12th International Symposium on Quality Electronic Design (ISQED) 8 pgs., (2011).
Kodandapani et al., "A Simple Algorithm for Fanout Optimization using High-Performance Buffer Libraries," 1993 IEEE/ACM International Conference on Computer-Aided Design, ICCAD-93, pp. 466-471, (1993).
Kung, David S., "A Fast Fanout Optimization Algorithm for Near-Continuous Buffer Libraries," Proceedings of Design Automation Conference (DAC) (1998), pp. 352-355, San Francisco, CA USA.
Rezvani et al., "A Fanout Optimization Algorithm Based on the Effort Delay Model," IEEE Transactions on Computer-Aided Design of Integrated Circuits and Systems, vol. 22, No. 12, pp. 1671-1678,(Dec. 2003).
Synopsys, "Synplify Premier: The Ultimate FPGA Implementation Platform," 4 pgs., (2011), Mountain View, CA, USA.

\* cited by examiner

CIRCUIT DESIGN IMPLEMENTATION USING CONTROL-SET BASED MERGING AND MODULE-BASED REPLICATION

FIELD OF THE INVENTION

This disclosure relates to circuit design implementation and, more particularly, to reducing the number of control sets and high fan-out nets in a circuit design for implementation.

BACKGROUND

Creating a circuit design for implementation within an integrated circuit such as a programmable IC is a complex process. This process is further complicated by ever increasing size of the circuit designs with ever more aggressive timing requirements. These circuit designs typically have a large number of control sets and a large number of high fan-out nets. Both control sets and high fan-out nets can present challenges to circuit design implementation and to meeting timing requirements.

SUMMARY

An embodiment includes a method of circuit design implementation using controls sets. The method can include selecting, using a processor, a first load and a second load each having a control pin of a same type driven by a different driver, determining, using the processor, whether the driver of the first load matches the driver of the second load, and modifying the circuit design, using the processor, to drive the control pins of the first load and the second load using the driver of the first load.

Another embodiment includes a method of circuit design implementation using module-based replication. The method can include selecting, using a processor, a net having a driver and a plurality of loads exceeding a high fan-out net threshold, determining, using the processor, a selected module of the circuit design having a number of the plurality of loads of the net that meet a cloning criteria, and, responsive to the determining, modifying, using the processor, the circuit design by creating a clone of the driver within the selected module and driving each load of the net within the selected module with the clone of the driver.

One or more other embodiments include a system. The system includes a processor configured to initiate the various executable operations and/or methods described within this disclosure.

One or more other embodiments include a computer program product including a computer readable storage medium having program code stored thereon. The program code is executable by a processor to perform operations and/or methods as described within this disclosure.

This Summary section is provided merely to introduce certain concepts and not to identify any key or essential features of the claimed subject matter. Other features of the inventive arrangements will be apparent from the accompanying drawings and from the following detailed description.

BRIEF DESCRIPTION OF THE DRAWINGS

The inventive arrangements are illustrated by way of example in the accompanying drawings. The drawings, however, should not be construed to be limiting of the inventive arrangements to only the particular implementations shown. Various aspects and advantages will become apparent upon review of the following detailed description and upon reference to the drawings.

DETAILED DESCRIPTION OF THE DRAWINGS

While the disclosure concludes with claims defining novel features, it is believed that the various features described within this disclosure will be better understood from a consideration of the description in conjunction with the drawings. The process(es), machine(s), manufacture(s) and any variations thereof described herein are provided for purposes of illustration. Specific structural and functional details described within this disclosure are not to be interpreted as limiting, but merely as a basis for the claims and as a representative basis for teaching one skilled in the art to variously employ the features described in virtually any appropriately detailed structure. Further, the terms and phrases used within this disclosure are not intended to be limiting, but rather to provide an understandable description of the features described.

This disclosure relates to circuit design implementation and, more particularly, to reducing the number of control sets and high fan-out nets in a circuit design for implementation within an integrated circuit (IC). Inclusion of a large number of control sets and/or high fan-out nets in a circuit design can adversely affect implementation of the circuit design leading to poor quality of results. For example, the resulting implementation may not meet established timing requirements. In other cases, the circuit design may be infeasible (e.g., where implementation of the circuit design within a given target IC is not physically possible).

One or more example embodiments described herein can analyze a circuit design and modify the circuit design to reduce the number of control sets included therein. One or more other example embodiments described herein can analyze a circuit design to reduce the number of high fan-out nets in the circuit design or eliminate the high fan-out nets from the circuit design. In the examples provided, control set processing may be performed on a standalone basis or may be performed followed by high fan-out net processing. Similarly, high fan-out net processing may be performed on a standalone basis or performed followed by control set processing.

For purposes of simplicity and clarity of illustration, elements shown in the figures have not necessarily been drawn to scale. For example, the dimensions of some of the elements may be exaggerated relative to other elements for clarity. Further, where considered appropriate, reference numbers are repeated among the figures to indicate corresponding, analogous, or like features.

Figure 1:
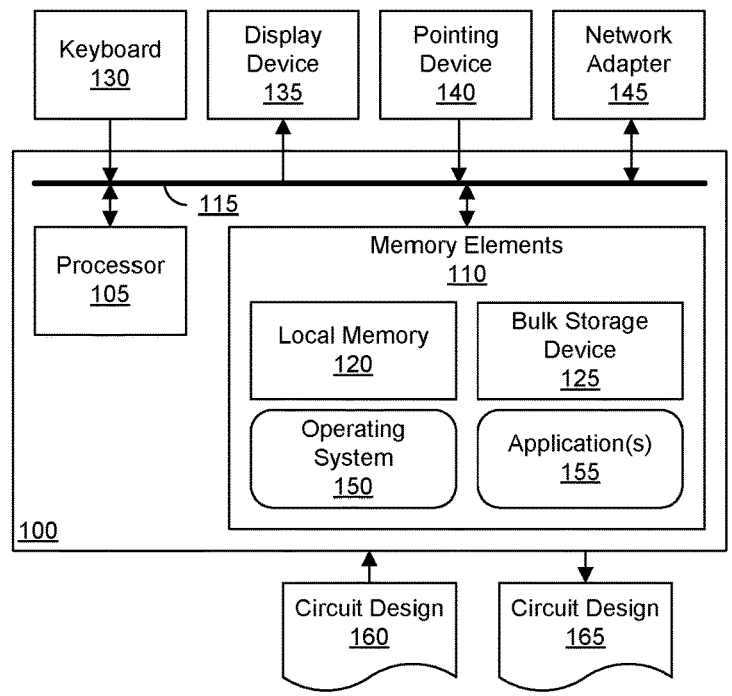
FIG. 1 is a block diagram illustrating an example data processing system.

FIG. 1 is a block diagram illustrating an example data processing system (system) 100. As pictured, system 100 includes at least one processor 105 coupled to memory elements 110 through a system bus 115 or other suitable circuitry such as an input/output (I/O) subsystem. System 100 stores computer readable instructions (also referred to as "program code") within memory elements 110. Memory elements 110 may be considered an example of computer readable storage media. Processor 105 executes the program code accessed from memory elements 110 via system bus 115.

Memory elements 110 include one or more physical memory devices such as, for example, a local memory 120 and one or more bulk storage devices 125. Local memory 120 refers to random access memory (RAM) or other non-persistent memory device(s) generally used during actual execution of the program code. Bulk storage device 125 may be implemented as a hard disk drive (HDD), solid state drive (SSD), or other persistent data storage device. System 100 may also include one or more cache memories (not shown) that provide temporary storage of at least some program code in order to reduce the number of times program code must be retrieved from bulk storage device 125 during execution.

System 100 may be coupled to one or more I/O devices such as a keyboard 130, a display device 135, a pointing device 140, and/or one or more network adapters 145. System 100 may include one or more additional I/O device(s) beyond the examples provided. The I/O devices described herein may be coupled to system 100 either directly or through intervening I/O controllers. In some cases, one or more of the I/O device(s) may be combined as in the case where a touch sensitive display device 135 (e.g., a touchscreen) is used. In that case, display device 135 may also implement keyboard 130 and/or pointing device 140.

Network adapter 145 is a communication circuit configured to establish wired and/or wireless communication links with other devices. The communication links may be established over a network or as peer-to-peer communication links. Accordingly, network adapter 145 enables system 100 to become coupled to other systems, computer systems, remote printers, and/or remote storage devices. Example network adapter(s) 145 include, but are not limited to, modems, cable modems, Ethernet cards, bus adapters, connectors, and so forth. Network adapter 145 may be a wireless transceiver, whether a short and/or a long range wireless transceiver.

As pictured, memory elements 110 may store an operating system 150 and one or more application(s) 155. Application 155, for example, may be an electronic design automation (EDA) application. In one aspect, operating system 150 and application(s) 155, being implemented in the form of executable program code, are executed by system 100 and, more particularly, by processor 105, to perform the various operations described within this disclosure. As such, operating system 150 and application 155 may be considered an integrated part of system 100. Operating system 150, application 155, and any data items used, generated, and/or operated upon by system 100 such as circuit designs whether expressed as register transfer level descriptions, a configuration bitstream, or another format are functional data structures that impart functionality when employed as part of system 100 or are provided to a target IC for implementation therein in a suitable format.

As defined within this disclosure, a "data structure" is a physical implementation of a data model's organization of data within a physical memory. As such, a data structure is formed of specific electrical or magnetic structural elements in a memory. A data structure imposes physical organization on the data stored in the memory as used by an application program executed using a processor.

System 100 may include fewer components than shown or additional components not illustrated in FIG. 1 depending upon the particular type of device that is implemented. In addition, the particular operating system and/or application(s) included may also vary according to device type as may the types of network adapter(s) included. Further, one or more of the illustrative components may be incorporated into, or otherwise form a portion of, another component. For example, a processor may include at least some memory.

As pictured in FIG. 1, system 100 may receive a circuit design 160. System 100 may analyze circuit design 160 to identify control sets included therein and/or high fan-out nets included therein. System 100 may modify circuit design 160 thereby generating a different circuit design 165. In one example embodiment, circuit design 165 may be functionally equivalent to circuit design 160. In one aspect, circuit design 165 has fewer control sets than circuit design 160. In another aspect, circuit design 165 has fewer high fan-out nets than circuit design 160.

Figure 2:
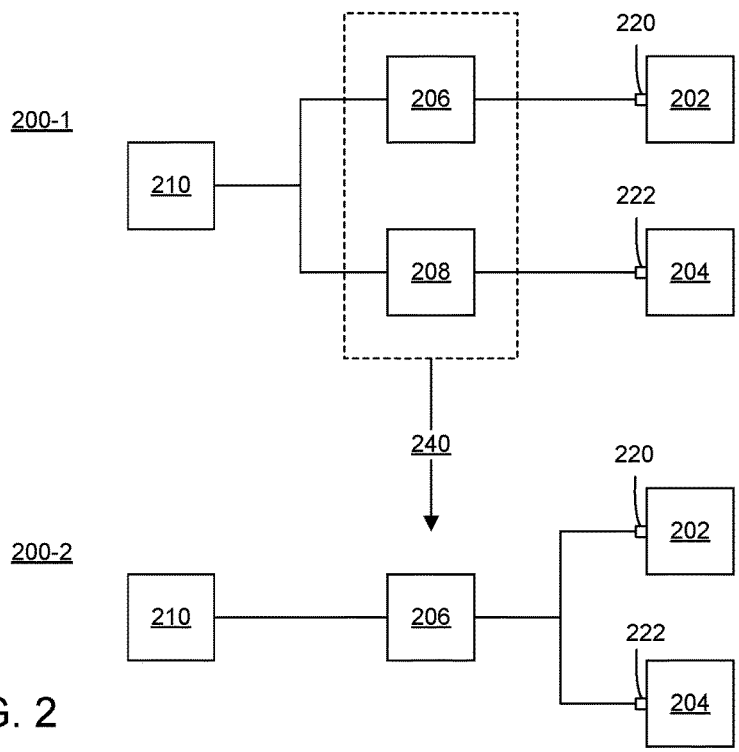
FIG. 2 is a block diagram illustrating an example of control set merging.

FIG. 2 is a block diagram illustrating an example of control set merging. FIG. 2 illustrates example operations that may be performed by a system as described with reference to FIG. 1. As pictured, circuit structure 200-1, which may be a portion of a circuit design, includes circuit components 202, 204, 206, 208, and 210. Circuit components 202 and 204 are loads.

Loads 202 and 204 may be flip-flops, latches, digital signal processing (DSP) circuit blocks, shift registers, slice RAMs, or other sequential circuit structures. While loads 202 and 204 may be a same type of circuit component (e.g., matched where both are flip-flops, or both are latches, or both are slice RAMs), in another example, loads 202 and 204 may be different types of circuit components. For example, load 202 may be a flip-flop while load 204 is a latch. Load 202 has control pin 220. Load 204 has control pin 222.

For purposes of discussion, FIG. 2 illustrates only one control signal being provided to each of circuit components 202 and 204. It should be appreciated that loads 202 and 204 may include other input signals (not shown), whether other control signals or data signals, and may include output signals (not shown). As used herein, the term "control pin" means an internal node of a circuit or a circuit design that is coupled to a control signal. For example, a control pin may be a node of a circuit component that is coupled to another circuit component such as an interconnect, a wire, a trace, and so forth that is configured to convey a control signal to the node. For synchronous circuit components, examples of control signals include set signals, reset signals, and clock enable signals. For asynchronous circuit components, examples of control signals include clock enable signals, reset signals, and clear signals.

In one example embodiment, the system determines that circuit component 206 is a driver of control pin 220 and, as such, a driver of load 202. Further, the system determines that circuit component 208 is a driver of control pin 222 and, as such, a driver of load 204. Examples of drivers may include, but are not limited to, flip-flops, multiplexers, exclusive OR circuit blocks, carry circuit blocks, or other circuit blocks that meet the criteria described herein.

The system is capable of analyzing circuit structure 200-1 to determine whether circuit components 202 and 204 are in a same control set. The term "control set" means two or more control pins of two or more different circuit components that are of a same control pin type and that are driven by a same control signal or a same instance of a driver circuit component. A control set can be a unique set of control and/or clock nets for sequential circuit components such as flip-flops, latches, slice RAMs, and so forth. Two circuit components are in a same control set when each of the two circuit components has a same control pin type (e.g., set, reset, clock enable, clear) that is driven by a same signal and/or a same driver circuit component (e.g., different instances of a same circuit component).

In the example of FIG. 2, a conventional system does not consider circuit components 202 and 204 to be part of a same control set due to the fact that load 202 is driven by a different driver than load 204. A conventional system unable to look beyond the fact that control pins 220 and 22 are driven by different physical drivers. The examples provided herein, however, illustrate how a system analyzes a circuit design by traversing upstream from control pins of a pair of loads to determine whether the loads are members of a same control set. If so, the drivers of the control pins of the loads may be merged through a driver merge operation 240.

In the example of FIG. 2, the system determines that while loads 202 and 204 have different drivers, the upstream driver for both of driver 206 and driver 208 is the same driver instance. In other words, driver 210 drives both of drivers 206 and 208. As such, the system determines that loads 202 and 204 are in the same control set. Accordingly, the system performs driver merge operation 240 so that loads 202 and 204 are driven by a same circuit component. The control sets of load 202 and load 204, initially considered different, are effectively merged. Circuit structure 200-2 results after the system performs driver merge operation 240. The system effectively removes driver 208 and uses driver 206 to drive both control pin 220 of load 202 and control pin 222 of load 204.

FIG. 2 is provided for purposes of illustration. Further details relating to the analysis of a circuit design for control set merging as performed by the system are described herein in greater detail with reference to FIGS. 3, 4, and 5. In performing control set merging, the system is capable of evaluating one or more or all of netlist connectivity, logical and/or physical constraints, and estimated timing.

Programmable ICs have architectures where smaller structural units, e.g., a "slice," may only include circuit components having same control sets. For example, for circuit components such as flip-flops to be placed into a same slice, the flip-flops must belong to the same control set(s). It can be seen from FIG. 2 that the number of control sets in a circuit design may adversely affect the quality of result obtained for a given implementation of the circuit design. If "N" refers to a number of flip-flops that can be placed in a slice and a control set contains only one flip-flop, the remaining N−1 flip-flops of the slice are not utilized. It follows that if a control set contains "M" distinct or unique components, then M-(N modulo M) components will be unused. This can result in a poor quality of results when implementing the circuit design (e.g., performing placement and/or routing).

As another example, consider a circuit design that includes hundreds of thousands of flip-flops. The circuit design is to be implemented in a target IC having an architecture where a slice can accommodate 16 flip-flops. In order for the system to place multiple flip-flops into a same slice of the target IC, each of the flip-flops must be members of the same control set. A large number of control sets can make placement of the circuit design difficult or even infeasible. If the circuit design has approximately 500,000 flip-flops and 20,000 different control sets, the number of flip-flops that cannot be located in a same slice is large. Reducing the number of control sets means that the number of flip-flops that cannot be located in a same slice is reduced, thereby increasing the likelihood that the system will successfully place the circuit design.

Figure 3:
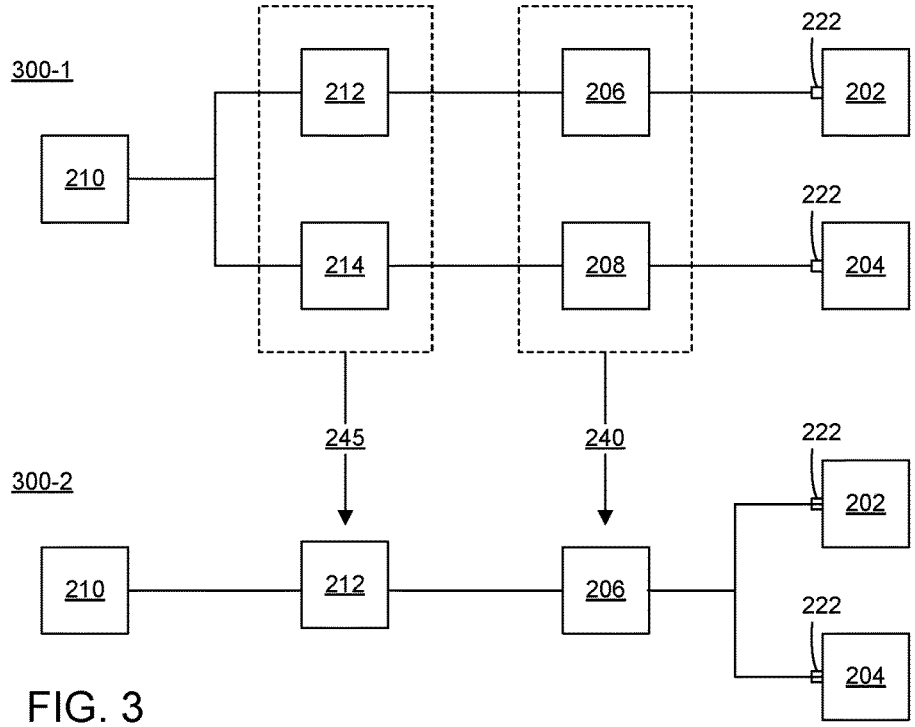
FIG. 3 is a block diagram illustrating another example of control set merging.

FIG. 3 is a block diagram illustrating another example of control set merging. FIG. 3 illustrates example operations that may be performed by a system as described with reference to FIG. 1. Circuit structure 300-1 is substantially similar to circuit structure 200-1 of FIG. 2. Circuit structure 300-1 includes an additional stage of circuit components 212 and 214. Circuit component 212 is a driver for circuit component 206. Circuit component 214 is a driver for circuit component 208.

In the example of FIG. 3, the system determines that loads 202 and 204 are in a same control set and, as such, performs driver merge operations 240 and 245. As discussed, driver merge operation 240 effectively removes driver 208 so that driver 206 drives both of loads 202 and 204. Driver merge operation 245 removes driver 214 so that circuit component 212 drives circuit component 206. Performance of driver merge operations 240 and 245 result in, or transform, circuit structure 300-1 to circuit structure 300-2. As such, the control sets are merged and the number of circuit components used to implement circuit structure 300-2 is less than the number of circuit components used to implement circuit structure 300-1.

Figure 4:
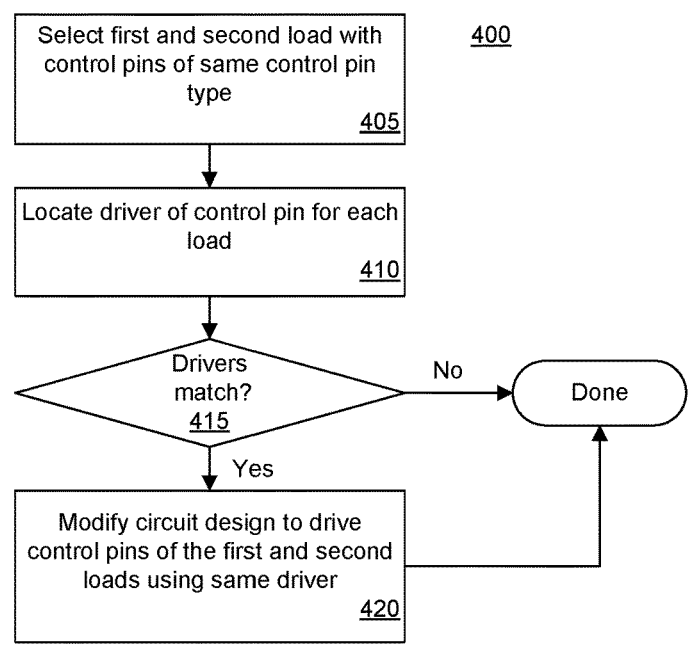
FIG. 4 is a flow chart illustrating an example method of control set merging.

FIG. 4 is a flow chart illustrating an example method 400 of control set merging. Method 400 can be performed by a system as described with reference to FIG. 1. The system may perform method 400 for a circuit design to reduce the number of control sets to facilitate implementation of the circuit design within a target IC.

In block 405, the system selects a first load and a second load of the circuit design. In selecting the loads, the system selects sequential circuit components. Further, the system selects the first and second loads where each load has a same control pin type. For example, the first load and the second load each can have a set type of control pin. Further, the system determines that the control pin of the first load is driven by a different driver or different driver instance than the control pin of the second load. In other words, each control pin driven by a different, physical circuit component. In this regard, the first load and the second load are at least initially considered members of different control sets for the set control pin type.

In block 410, the system locates the driver of the control pin for first load and the driver of the control pin for the second load. The located drivers may be referred to as a driver pair for purposes of discussion. The system analyzes the connectivity of the loads to locate the driver for the control pin of each load from within the circuit design.

In block 415, the system determines whether the drivers of the driver pair match. If so, method 400 continues to block 420. If not, method 400 may end. In one aspect, the system determines whether the drivers match based upon criteria that can include component type, connectivity, constraints, and, if desired, timing estimates.

For example, in order for the drivers of the driver pair to match, the system determines that both of the drivers of the driver pair are same circuit component types. For example, both of the drivers of the driver pair must be flip-flops, or both must be 4-input lookup tables (LUTs), etc. In addition, both drivers of the driver pair must have the same configuration. In the LUT example, both LUTs must implement the same, i.e., identical, functionality as specified by the configuration data for each LUT.

In another example, in order for the drivers to match, the system determines that both drivers of the driver pair have the same input connectivity. For example, the system must determine that the inputs of both drivers of the driver pair receive the same signals or are driven by the same instance of a driver as illustrated in FIGS. 2 and 3.

In still another example, in order for the drivers to match, the system determines that the drivers are not associated with, e.g., subject to, a physical constraint or a logical constraint. A "physical constraint" refers to a directive that specifies an exact placement or implementation for a circuit component of the circuit design. For example, a physical constraint may indicate that a signal is to be located at a top-most pin of a circuit block and also specify the particular circuit block instance on the target IC where the signal is to connect. In another example, a physical constraint may specify a particular location or site where a particular circuit component is to be implemented or assigned (e.g., placed) on the target IC.

A "logical constraint" refers to a directive that indicates how a particular circuit component or group of circuit components are to be processed during one or more phases of the design flow. An example of a logical constraint is one that requires a particular circuit component, e.g., a LUT, to be located in a particular region (e.g., a top-most region) of each logic area of the circuit design. The logical constraint provides direction to the system without specifying an exact location or implementation for the circuit components covered by the constraint. Another example of a logical constraint may specify that a particular signal should be located at a top-most pin of a circuit block of the target IC without requiring that the signal be located at any one particular instance of the circuit block on the target IC.

In illustration, the system may determine whether the drivers are subject to physical and/or logical constraints such as location placer constraints (LOC) or whether the instances of the drivers are in hierarchies separated by "DONT_TOUCH" attributes any of which would prevent merging.

In yet another example, in order for the drivers to match, the system can first determine that the timing information for both drivers of the driver pair matches. For example, the system can compare timing information for the drivers of the driver pair. Based upon the comparison, the system can determine whether the timing information matches. Timing information for both drivers is said to match when the timing information for each driver of the driver pair being evaluated is within a range of the other.

In one example, the system is capable of analyzing timing and/or timing exceptions and determining the slack at every pin of the driver, e.g., all driver, instance(s). As defined within this disclosure, the term "slack" is the difference between a required arrival time of a signal at a circuit element, e.g., a signal arriving at a load of a net from the source, and an estimated arrival time of the signal at the circuit element. A positive slack indicates that the path meets a timing requirement, or timing constraint, for the path. A negative slack indicates that the path does not meet a timing requirement for the path. The path is slower than the requirement for the path. The estimated arrival time of a signal to the load of the path is after the required arrival time (e.g., the requirement).

In one embodiment, the system is capable of performing a clustering technique using the slacks to assign different drivers to different categories. The system is capable of placing those drivers having similar slack (e.g., matching timing information) into same categories. One example technique is to sort the drivers from lowest slack to highest slack. The system is capable of splitting the sorted drivers into N different groups, where N is an integer greater than 2 and may be adjustable according to preference.

Another example technique is to determine the drivers that are meeting timing. The system is capable of forming a group of those drivers that are meeting timing and another, different group of those drivers that are not meeting timing. In another example, the system is capable of forming a group that includes the drivers not meeting timing that are within a percentage of the timing of the worst path delay.

Thus, the system can determine that the timing of two drivers is similar or matches if the two drivers are assigned to a same group. Regardless of the manner in which grouping and/or clustering is performed, the system is capable of determining whether drivers of the driver pair are within the same group. If so, the system may perform the merge operation. If not, the system may not perform the merge operation.

Accordingly, responsive to the system determining that the drivers of the driver pair match based upon one or more or all elements of the described criteria, method 400 can continue to block 420. In block 420, the system modifies the circuit design to drive the control pins of the first and second loads using the same driver. The system can perform a driver merge operation on the driver pair. For example, the system selects one of the drivers of the driver pair, e.g., the first driver or the second driver, and disconnects the input(s) and output(s) of the driver from other circuit components in the circuit design. The system can then remove the selected driver. The system then connects the output of the driver of the driver pair remaining in the circuit design to the disconnected load. For example, if the second driver is removed, the first driver is connected to drive the second load (e.g., both the first and second loads).

It should be appreciated that the operations described with reference to FIG. 4 may be performed in an iterative manner. For example, the system may perform method 400 for each pair of loads to be analyzed. In one aspect, the system may form a group of loads where each load has a same type of control pin and where the loads are, at least initially, in different control sets with respect to the same type of control pin used to form the group. The system may perform the operations described in method 400 for each pair (or for all pairs) of loads in the group. The system can compare the loads of the group in pairwise fashion. For example, if the group includes loads A, B, and C, the system compares loads A and B, then compares loads B and C, and then compares loads A and C.

Further, control set merging, as described herein, may be performed for each different type of control set pin. Consider two load flip-flops A and B that have reset control pins that are processed as described herein for the reset control pins. In that case, the flip-flops A and B may have set control pins that may not be merged. It is also possible that flip-flop A and flip-flop C have set pins that may be merged. The control set merging described herein with reference to FIG. 4 may be performed for flip-flops A and B for the reset pins even if unsuccessful and then again independently for flip-flops A and C for the set pins.

Figure 5:
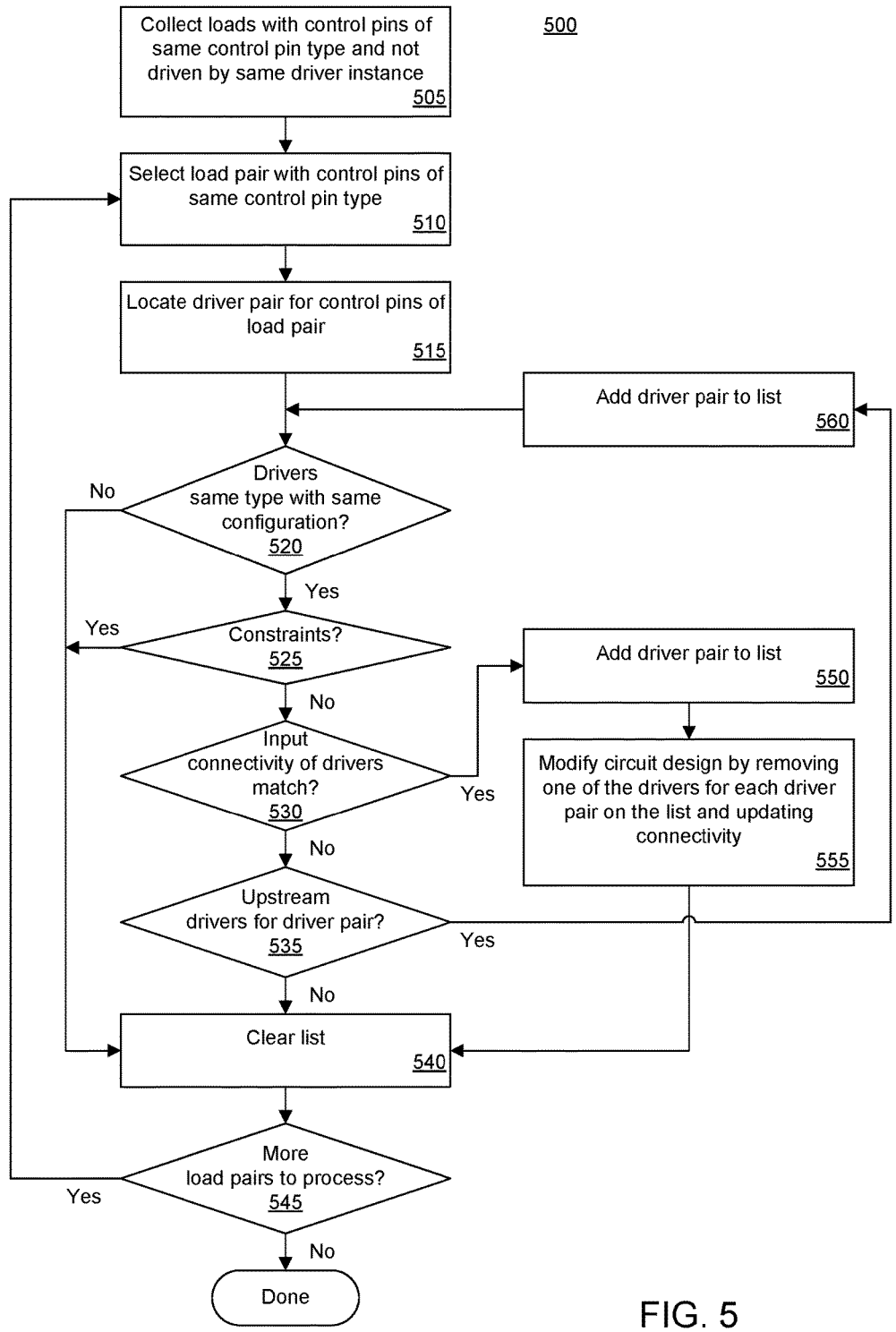
FIG. 5 is a flow chart illustrating another example method of control set merging.

FIG. 5 is a flow chart illustrating another example method 500 of control set merging. Method 500 can be performed by a system as described with reference to FIG. 1. Method 500 illustrates a more detailed example of control set merging. Method 500 may begin in a state where the system identifies a circuit design for processing.

In block 505, the system collects loads with control pins of a same control pin type that are not driven by a same driver or instance of a driver. For example, the system collects loads of the circuit design that each have a set control pin, or a reset control pin, or a clock enable control pin, or a clear control pin. The different types of control pins can be processed separately, e.g., in further iterations of the example method 500. For purposes of illustration, the system may collect loads that have set control pins where the set control pins are driven by different instances of a driver.

In block 510, the system selects a pair of loads, e.g., a first load and a second load forming a load pair from the set of loads collected in block 505. In block 515, the system locates a driver pair for the control pins of the load pair. The system determines the driver that drives each of the control pins of the selected load pair. Referring again to the example, the system determines the driver that drives the set control pin of first load and the driver that drives the set control pin of the second load.

In block 520, the system determines whether the drivers are the same type of circuit component and have a same configuration. If so, method 500 continues to block 525. If not, method 500 proceeds to block 540. In proceeding to block 540 from block 520, the system determines that the first load and the second load of the load pair being processed are not part of the same control set at least with respect to the type of control pins being evaluated. Accordingly, any driver pairs that the system may have placed on the list for processing for the load pair are removed by clearing the list in block 540.

In block 525, the system determines whether either one or both of the drivers of the driver pair are subject to a constraint. For example, the system determines whether either one or both of the drivers of the driver pair is subject to a physical constraint or a logical constraint. If so, method 500 proceeds to block 540. If not, method 500 continues to block 530. In proceeding to block 540 from block 525, the system determines that the first load and the second load of the load pair being processed are not part of the same control set at least with respect to the type of control pins being evaluated. Accordingly, the driver pairs that the system has placed on the list for processing for the load pair are removed by clearing the list in block 540.

In block 530, the system determines whether the input connectivity of the drivers match. As discussed, the system determines whether the inputs of each driver of the driver pair match, e.g., are connected to same signals or a same instance of a driver for each input pin (e.g., whether data or a control signal). If so, method 500 continues to block 550. If not, method 500 proceeds to block 535.

In block 535, the system determines whether the driver pair has upstream drivers. For example, the system determines whether each driver of the driver pair is driven by a different driver instance. If so, method 500 continues to block 560, where the current driver pair is added to the list for processing. After block 560, method 500 continues to block 520 where the upstream drivers identified in block 535 become the current driver pair. If the system determines that the driver pair does not have any upstream drivers in block 535, method 500 proceeds to block 540. In proceeding from block 535 to block 540, the system determines that the first load and the second load of the load pair being processed are not part of the same control set at least with respect to the type of control pins being evaluated. The current driver pair does not have same connectivity and is not driven by further upstream drivers. Accordingly, the driver pairs that the system has placed on the list for processing for the load pair are removed by clearing the list in block 540.

Continuing with block 550, the system adds the driver pair (e.g., the current driver pair) to the list. In block 555, the system modifies the circuit design by removing one of the drivers for each driver pair on the list and updating connectivity. For example, the system can perform a driver merge operation for each driver pair on the list. As described in connection with FIGS. 2 and 3, the system selects a driver from each driver pair on the list. The system disconnects the signals from each selected driver and removes or deletes each selected driver from the circuit design. The system then connects the remaining driver of the driver pair closest to the load pair to the disconnected load. For example, referring to FIG. 3, the system selects drivers 214 and 208, disconnects drivers 214 and 208, removes drivers 214 and 208 from the circuit design, and connects driver 206 to driver load 204.

After block 555, method 500 can continue to block 540. In continuing from block 555 to block 540, the system has determined that the load pair belongs to a same control set at least with respect to the type of control pins being evaluated. In block 540, the system clears the list in order to begin processing another load pair.

In block 545, the system determines whether there are any further load pairs to process from the set of loads collected in block 505. If so, method 500 loops back to block 510 to begin processing a next load pair. If not, method 500 may end. It should be appreciated that method 500 may be performed for different control pin types as required to continue reducing the number of control sets within the circuit design.

Though not shown in FIG. 5, in another example, method 500 can include a timing check as described in connection with FIG. 4. For example, the system may cluster the drivers. The system may also ensure that two drivers of a driver pair are part of a same group, e.g., have similar or matching timing information, in order to perform the merge operation(s) described herein.

In accordance with the example embodiments described within this disclosure, control set merging involves the removal of circuit components (e.g., drivers and signals) from the circuit design. Circuit components are not added. As such, control set merging may be performed at any stage within a circuit design flow. For example, control set merging may be performed at the logical stage of a design flow after synthesis, after placement, or after routing since the system only deletes instances and modifies connectivity.

Different load types having drivers that may be merged to reduce the number of control sets in a circuit design may be collected. The system may traverse the circuit design, e.g., a netlist, backward from the loads (e.g., upstream) to the drivers. In one aspect, an instance of a driver is deemed parallel to another driver and, as such a candidate for merging, if the connectivity on the inputs of the driver is the same as the connectivity on the inputs to the instance in question.

The system may identify problematic control nets that require merging. Input pins on a driver D pin can be traversed with each net coupled to an input being traversed for connected input pins. For purposes of illustration, consider a case where a driver has an input A that connects to a set of input pins called "Sa." The set of input pins Sa has a total number of pins of "Na." Another input of the driver called input B has a set of pins called "Sb." The set of pins Sb has a total number of pins Nb. The instances of the two sets Sa and Sb may be ideational, completely different, or have some (not all) matches. If Na is greater than NB, the set Sa has some additional instance connections that are not within set Sb. In that case, all instances in set Sa are not parallel in terms of connectivity. It also follows that the set of possible equivalent drivers is the smallest set of connected input pins Ss on the instance D. This reduces the sample space to search for equivalent drivers to improve running time of the system in performing control set merging.

Comparison of N possibly equivalent drivers two at a time is an $O(n^2)$ expensive operation. Failure of equivalence checking can be due to non-equivalent cell type or connectivity. Using a hash map where the key is a representation of the instance cell type and/or input connectivity provides a $O(1)$ way of reducing the sample space for rigorous $O(n^2)$ comparisons. The value in the hash map can be a set of equivalent instances. Sets with greater than one element can be considered for rigorous comparison in $O(n^2)$ time. Sets with one element can be ignored as there is no scope for merging.

In order to merge two instances, the output of the instance to be merged (208) can be traversed for loads. The loads must be disconnected and re-connected to the output pin of the merged instance (206). In another aspect, instead in traversing the output pin hierarchy of 208, the hierarchical pins encountered in a path can be stored for moving. If a hierarchical cell H, for example, has a pin P that drives L loads within the cell, by moving the pin P instead of individual loads L, L–1 moves can be avoided thereby saving time and decreasing runtime. For a successful move, all loads on the output pin of circuit component 208 must have been moved to the output pin of circuit component 206. Once moved, the input pins and output pin of circuit component 208 are disconnected; and, circuit component 208 can be deleted from the circuit design.

After performing control set merging as described herein, the number of control sets is reduced and/or minimized. Reduction in the number of control sets is beneficial so that the design flow stages such as placement do not suffer from excessive control set congestion. This often means that the placer output is closer to the timing convergence.

In accordance with another aspect, high fan-out nets of the circuit design may be reduced by applying a module-based replication technique. By reducing high fan-out nets, the performance of the resulting circuit design, as implemented within a target IC, can be improved in terms of higher operating frequency. The example embodiments for reducing high fan-out nets may be applied to the entire circuit design. As such, the system may operate on sequential portions of a circuit design, combinatorial portions of a circuit design, and input and output nets. The example embodiments for reducing high fan-out nets may be performed in combination with the control set processing described or independently as noted.

In one example embodiment, placement and connectivity sharing of primitives present in a single hierarchical module may be leveraged. For each net that has more than a threshold number of loads, a clone of the driver may be created on a hierarchical module basis. For a net considered to be a high fan-out net, the system may create a clone of the driver for each hierarchical module that has more than a threshold number of loads of the high fan-out net. As an illustrative example, if a net has 2,100 loads and all of the loads are in a single hierarchical module of the circuit design, then no clone may be created. If the net has 1,000 loads in hierarchical module A, 400 loads in hierarchical module B, and 700 loads in hierarchical module C, the system may create two clone drivers. One clone driver may be for hierarchical module A and the other for hierarchical module C.

Figure 6:
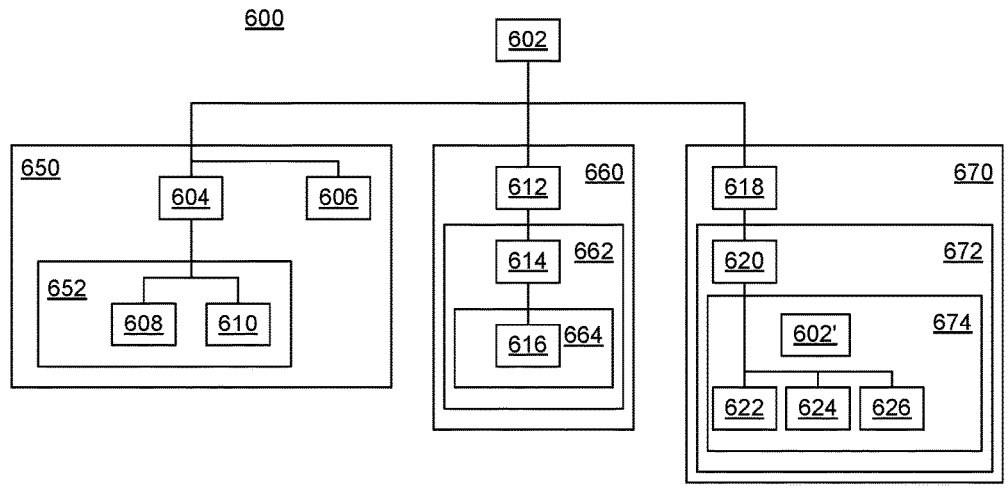
FIG. 6 is a block diagram illustrating an example of module-based replication for a high fan-out net.

FIG. 6 is a block diagram illustrating an example of module-based replication for a high fan-out net 600. As pictured, net 600 includes a driver 602 and loads 604-626. Loads 604-626 are distributed across a plurality of hierarchical modules (modules). Each module that includes other modules is said to include the load of each module below (or included in that module) in the hierarchy. For example, module 650 includes loads 604, 606, 608, and 610. Module 650 includes module 652. Module 652 includes loads 608 and 610.

Module 660 includes loads 612, 614, and 616. Module 660 includes modules 662 and 664, where module 664 is included within module 662. Module 662 includes loads 614 and 616. Module 664 includes load 616. Module 670 includes loads 618, 620, 622, 624, and 626. Module 670 includes module 672 and module 674. Module 674 is included within module 672. Module 672 includes loads 620, 622, and 625. Module 674 includes loads 622, 624, and 626.

The system may process net 600 on a per module basis. For example, the system may evaluate the number of loads of net 600 within the various modules of the circuit design. In response to determining that a module meets cloning criteria, the system may create a clone driver, e.g., a clone or additional instance of driver 602, for the module. For purposes of illustration, consider the case where module 674 meets the clone criteria. In that case, the system may create a clone driver of driver 602, shown as 602', for module 674. In that case, the system can disconnect loads 622, 624, and 626 from driver 602, insert clone driver 602' within module 674, and connect clone driver 602' with each of loads 622, 624, and 626.

Figure 7:
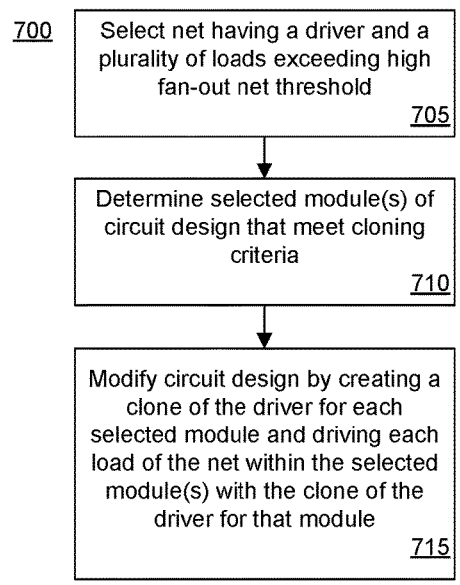
FIG. 7 is a flow chart illustrating an example method of module-based replication for a high fan-out net.

FIG. 7 is a flow chart illustrating an example method 700 of module-based replication for a high fan-out net. Method 700 may be performed by a system as described with reference to FIG. 1. Method 700 may begin in a state where a circuit design is selected upon which the system is to operate.

In block 705, the system can select a net having a driver and a plurality of loads exceeding a high fan-out net threshold. The high fan-out net threshold is the number of loads that a net must have, as a minimum, to be considered a high fan-out net. In one aspect, the high fan-out net threshold may be a system preference. The system preference may be editable. As an example, the high fan-out net threshold may be set to 5,000 loads, 10,000 loads, 15,000 loads, 20,000 loads, and so forth. The particular examples to which the high fan-out net threshold can be set are not intended as limitations.

In block 710, the system can determine one or more modules, e.g., "selected" modules, of the circuit design having a number of the plurality of loads of the high fan-out net that meet a cloning criteria. For example, the system may determine each of the modules of the circuit design that includes any loads of the high fan-out net. The system may evaluate the number of loads within each such module based upon the cloning criteria. The system selects each module having a number of loads of the net that meet or exceed the cloning criteria.

As illustrated with reference to FIG. 6, the modules of the circuit design are hierarchically organized. The system determines which of the modules of the circuit meet the cloning criteria. In one aspect, the cloning criteria can include a lower threshold. In another aspect, the cloning criteria can include an upper threshold and a lower threshold specifying a range. If the number of loads of the high fan-out net located within a module are within the range, for example, the system can determine that the module meets the cloning criteria. For example, the upper threshold may be set to 800, with the lower threshold set to 500. Accordingly, any module with a number of loads of the high fan-out net in the range of 500 to 800 is determined to meet the cloning criteria. The example upper and/or lower thresholds disclosed herein are for purposes of illustration only and not limitation. The upper threshold is less than the high fan-out net threshold. Similarly, the lower threshold is lower than the upper threshold.

In block 715, the system modifies the circuit design by creating a clone of the driver for each selected module and driving each load of the net within the selected module(s) with the clone of the driver for that module. For example, the system can create a clone of the driver within each of the modules that meets the cloning criteria. The system inserts a clone of the driver within each such module. As such, block 715 adds a circuit component to the modules identified in block 710. In addition, the system can disconnect each load of the high fan-out net within the selected module(s) and connect each of the disconnected loads to the clone of the driver inserted into the respective module(s).

For example, the system may identify modules A and B in block 710. Accordingly, the system inserts a clone of the driver of the high fan-out net within module A and another clone of the driver within module B. The system disconnects each load of the net within modules A and B from the driver. The system connects each load of the net within module A to the clone of the driver inserted into module A. The system further connects each load of the net within module B to the clone of the driver inserted into module B. In this manner, the system reduces the number of loads of the high fan-out net.

Figure 8:
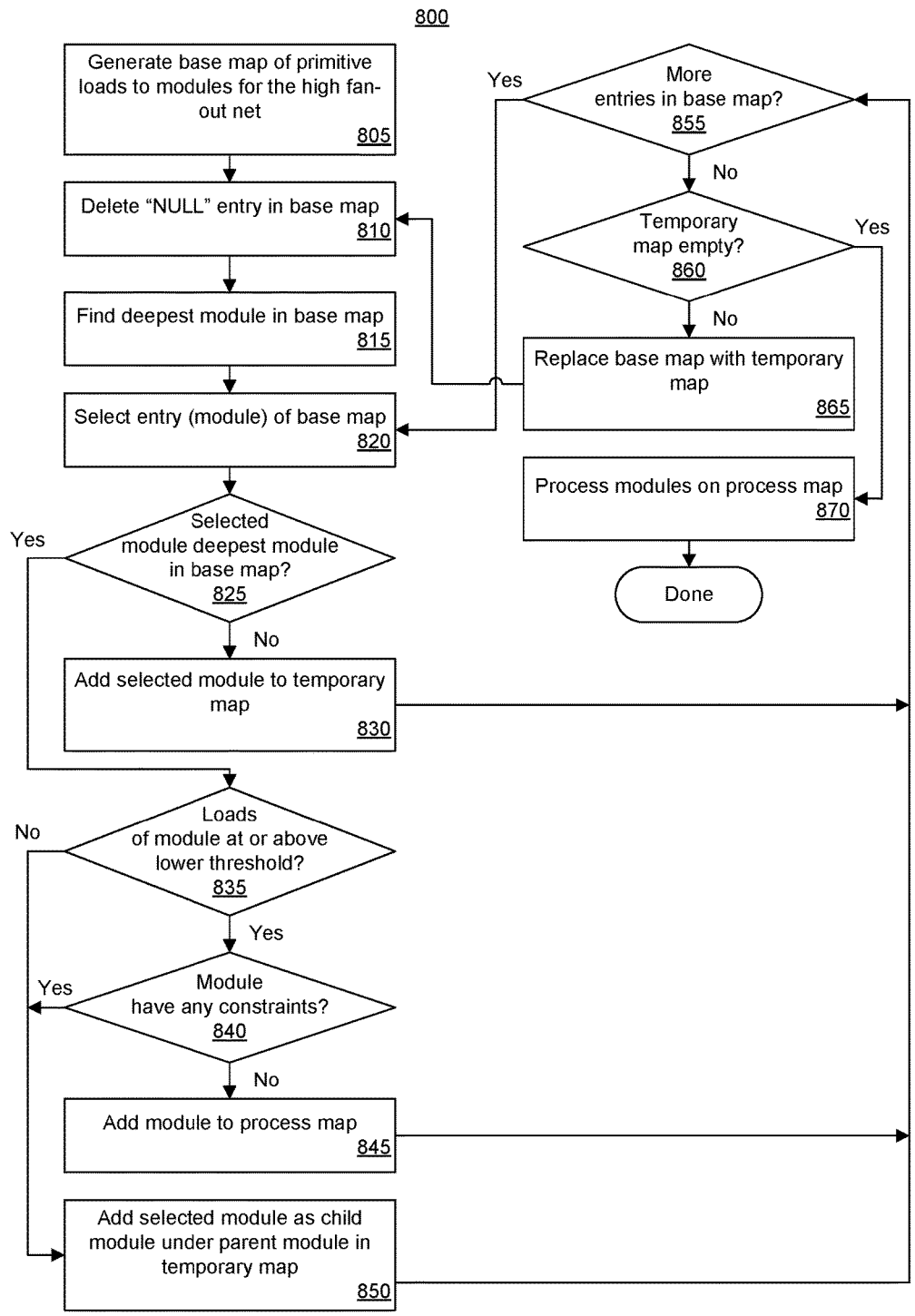
FIG. 8 is a flow chart illustrating another example method of module-based replication for a high fan-out net.

FIG. 8 is a flow chart illustrating another example method 800 of module-based replication for a high fan-out net. Method 800 illustrates a more detailed example of high fan-out net processing. Method 800 may be performed by a system as described with reference to FIG. 1. Method 800 may begin in a state where a circuit design is selected upon which the system is to operate. Further, the system may have selected a high fan-out net, e.g., a net with a number of loads meeting or exceeding the high fan-out net threshold.

In one example embodiment, the system is capable of performing screening by checking that the driver of the high fan-out net is a particular type of circuit component such as a flip-flop or a LUT. The system may skip processing of high fan-out nets where the driver is not an enumerated type of circuit component (e.g., a flip-flop or a LUT). Applying this screening prevents duplication of more complex drivers such as digital signal processing circuit blocks, multiplexer circuit blocks, and so forth that would consume too many resources of the target IC.

In another example embodiment, the system is capable of performing further screening of high fan-out nets. For instance, the system may determine whether the driver of the high fan-out net is placed. In one aspect the system may skip processing of a high fan-out net with a placed driver. In another example, the system may determine whether the driver is subject to a constraint. In illustration, the system may determine whether the driver is subject to a "no async reg" constraint, which prohibits replication of the driver. If the driver is subject to a constraint, e.g., a no async reg constraint, the system may skip processing of the high fan-out net.

In block 805 the system is capable of generating a base map of primitive loads to modules for the high fan-out net. For example, the system identifies the primitive loads of the high fan-out net and generates a base map specifying mappings of parent modules to loads. Each entry in the base map can specify which module includes which primitive load(s) of the net. In one aspect, the parent module may be used as a key. The primitive loads or child modules connected to the net may be the mapped value(s). A single entry in the base map, for example, can contain the primitive loads of the net mapped to their parent module.

In another example embodiment, the system is capable of applying screening to loads of the high fan-out net. In one example, the system may determine whether any of the loads of the high fan-out net are placed. If so, the system may skip processing of the high fan-out net. In another example, the system may determine whether any of the loads of the high fan-out net are subject to a constraint. For instance, the system can determine whether any of the loads of the high fan-out net are subject to a no async reg constraint. If so, the system may skip processing of the high fan-out net.

The system may begin processing parent modules of the high fan-out net to identify those parent modules having a load count greater than a lower threshold of the cloning criteria. The system can iteratively create a new, or temporary map, that may replace the base map. The system can continue processing the temporary map used to replace the base map is empty indicating that all of the entries of the base map have been processed. The system may also maintain, or create, a processing map that specifies each entry for which a clone of the driver is to be created.

In block 810, the system may delete the "NULL" entry in the base map. The "NULL" entry is the top view. In the example of FIG. 8, loads of the high fan-out net in the top view are left on the original driver of the high fan-out net.

In block 815, the system is capable of finding the deepest module in the base map. In one example embodiment, the system sorts the entries in the base map based upon depth of the parent modules. The system, for example, sorts the entries based upon the depth of the parent modules within the hierarchy of modules of the circuit design relative to other entries in the base map. In one aspect, the system can operate on, e.g., traverse, the modules that are the deepest in the hierarchy first, then proceed to operating on ancestors of the modules, and so forth.

In block 820, the system may select a module of the base map. In block 825, the system can determine whether the module is the deepest module in the base map. If so, method 800 can continue to block 835. If not, method 800 can proceed to block 830. In block 830, the system can add the selected module to the temporary map. In adding the selected module to the temporary map, the system can remove the selected module from the base map. In cases where the temporary map already includes an entry including the current module, the system can merge the entry already included in the temporary map with the selected module (entry for the selected module) from the base map. After block 830, method 800 proceeds to block 855.

In the case where the selected module is the deepest module of the base map, in block 835, the system can determine whether the total number of primitive loads of the net within the module is greater than or equal to the lower threshold. If so, method 800 can continue to block 840. If not, method 800 can proceed to block 850. In another example, the system can determine whether the total number of primitive loads of the net within the module is greater than or equal to the lower threshold and does not exceed the upper threshold less than the high fan-out net threshold (e.g., is within a range).

In block 840, the system can determine whether the module has any constraints. In one example embodiment, the system can determine whether the module has any constraints that prevent port punching. The system can determine whether the module has any constraints that prevent disconnecting and/or connecting terminal nets. If the module is subject to constraints, e.g., those described, method 800 can proceed to block 850.

In block 845, the system adds the module to a process map that includes modules (e.g., entries) that are to be processed to reduce fan-out of the high fan-out net. Performance of block 845 removes the module from the base map. The system adds the module to the process map responsive to determining that the module is suitable for clone creation, e.g., the system determines that the module meets the cloning criteria. After block 845, method 800 continues to block 855.

In block 850, the system adds the selected module as a child module under the parent module in the temporary map. In performing block 850, the module is also removed from the base map. In one example embodiment, in performing block 850, the system merges the module with the parent module. In considering the merged module in future iterations, the merged module, existing at the parent level of the hierarchy, may not be subject to the constraints to which the child module was subject, thereby allowing the module to be potentially added to the process map when the other criteria are met.

In block 855, the system determines whether the base map includes any further entries (e.g., modules) to process. If so, method 800 continues to block 820 to select a next entry and continue processing. If not, method 800 may proceed to block 860. In block 860, the system determines whether the temporary map is empty, e.g., has no entries. If so, method 800 continues to block 870. If not, method 800 proceeds to block 865.

In block 865, the system replaces the base map with the temporary map. The system makes the temporary map the base map and proceeds to create a new temporary map for further processing. The system may replace the base map with the temporary map responsive to processing all of the entries of the base map and determining that the temporary map is not empty. After block 865, method 800 proceeds to block 810 to continue processing using the base map. In proceeding to block 810, the system is capable of creating a new temporary map.

In general, the temporary map includes fewer entries than the base map due to merging of modules. Over time, as the base map is continually replaced by the temporary map, the temporary map eventually is empty thereby causing the system to discontinue processing. For example, the modules are either removed via block 845, merged via block 850, or top level modules are removed via block 810 to continue reducing modules of the temporary map and/or base map.

In block 860, the system processes the modules of the process map. As noted, the process map consists of those module to primitive load mappings for which a clone will be created. In one example embodiment, the system processes each entry in the process map and, for each module, creates a clone (e.g., a new clone) of the driver inside that module. The system then disconnects the loads of the net from the original driver and connects the disconnected loads within the module(s) to the newly created clone of the driver within each respective module.

After block 860, method 800 can end. In another aspect, however, the system may perform a verification to ensure that the number of loads of the high fan-out net at the start of method 800 match the load count at the completion of method 800. The system may compare the number of loads of the high fan-net at the start of method 800 and with the sum of the number of loads of the original driver and number of loads of each clone of the driver inserted into the circuit design by operation of method 800. The load count should be equal.

The module based replication operations described within this disclosure observe module hierarchy in that the contents of a module are considered closely connected to one another and, as such, may receive a clone of the driver. Further, the use of the range or thresholds in determining whether a module meets the cloning criteria prevents inefficient driver replication in situations where modules with few loads (e.g., 20 loads or a number of loads below the lower threshold) receive a clone of the driver.

Similarly, the example embodiments evaluate the module hierarchy of the circuit design and traverse upper level modules with more loads than the upper threshold of the cloning criteria to reach the lower level modules where the number of loads of the high fan-out net meet the cloning criteria (e.g., are in the defined range). For example, where the upper threshold is 700, the system does not create a clone of the driver for a higher level module with 2,000 loads, and, instead, traverses to the child modules where the number of loads in the child module of the high fan-out net are within the defined range. Providing a clone of the driver for a module that includes 2,000 loads of the high fan-out net may still be considered a high fan-out net and not be of significant value.

The embodiment of FIG. 8 illustrates an example where the system effectively combines smaller modules and moves up the hierarchy. In cases where the system creates a clone of the driver and requires further ports, the system may perform port punching for the module, e.g., the creation of a new port with one or more signals to support the inclusion of the clone of the driver.

In another example embodiment, a high fan-out net may not have any one (e.g., single) module that includes a number of loads of the high fan-out net that meets the cloning criteria. In that case, the system can select a plurality of modules of the circuit design on a same level of the hierarchy (e.g., sibling modules) of the circuit design that, when taken collectively, have a number of loads of the net that meet the cloning criteria. In that case, the system can insert a clone of the driver into the circuit design, disconnect the loads of each of the selected modules from the original driver, and connect the loads to the clone of the driver. The identified modules are effectively treated as the "selected" module that does meet the cloning criteria for purposes of inserting a clone of the driver and driving loads. In this example, the loads from multiple modules are driven by the same clone of the driver.

In another example embodiment, rather than deleting the "Null" entry in the base map, the system may not place the Null entry on the temporary map so that the Null entry need not be deleted from the base map.

In a further example embodiment, the system may incorporate timing into the module-based replication. As an illustrative example, the system may determine the slack of the loads of the high fan-out net within the modules. The system is capable of performing a clustering technique to assign the loads to different categories or groups based upon the timing information, e.g., slacks. For example, in the case where the system determines that a module does meet the cloning criteria, the system may insert one clone of the driver into the module for each different group. Thus, if the module meets the cloning criteria and the loads of the high fan-out net within the module are within two or more different groups, the system creates one clone of the driver for each different group of loads within the module. The system then drives each of the loads within the module with the clone of the driver for the group to which the load belongs.

In another example, the system may form groups according to timing constraints of differing degrees. For example, the system may form groups of loads of the high fan-out net using timing information where one group includes loads that are already meeting timing requirements (e.g., have positive slack). The system may form a group of loads of the high fan-out net that have negative slack and/or negative slack where the negative slack values are within a certain percentage of the worst negative slack of the circuit design. As an example, the loads that are in the worst 10% of the path slacks of the circuit design or the high fan-out net may be placed in a group. The system may assign the remaining loads to a different group. Each group may receive its own clone of the driver that drives the loads of that group in the event the module meets the clone criteria.

The example embodiments described within this disclosure may be used to process circuit designs for any of a variety of different target ICs. For example, the system may process circuit designs for implementation within target ICs that are programmable. One example of an IC that can be programmed is a field programmable gate array (FPGA). Another example of a programmable IC is a complex programmable logic device. For these types of programmable ICs, the functionality of the device is controlled by data bits provided to the device for that purpose. The data bits may be stored in volatile memory (e.g., static memory cells, as in FPGAs and some CPLDs), in non-volatile memory (e.g., FLASH memory, as in some CPLDs), or in any other type of memory cell.

Other types of programmable ICs include devices programmed by applying a processing layer, such as a metal layer, that programmably interconnects the various elements on the device. These programmable ICs are known as mask programmable devices. Programmable ICs may also be implemented in other ways, e.g., using fuse or antifuse technology. The phrase "programmable IC" may include, but is not limited to, these devices and further may encompass devices that are only partially programmable. For example, one type of programmable IC includes a combination of hard-coded transistor logic and a programmable switch fabric that programmably interconnects the hard-coded transistor logic.

Figure 9:
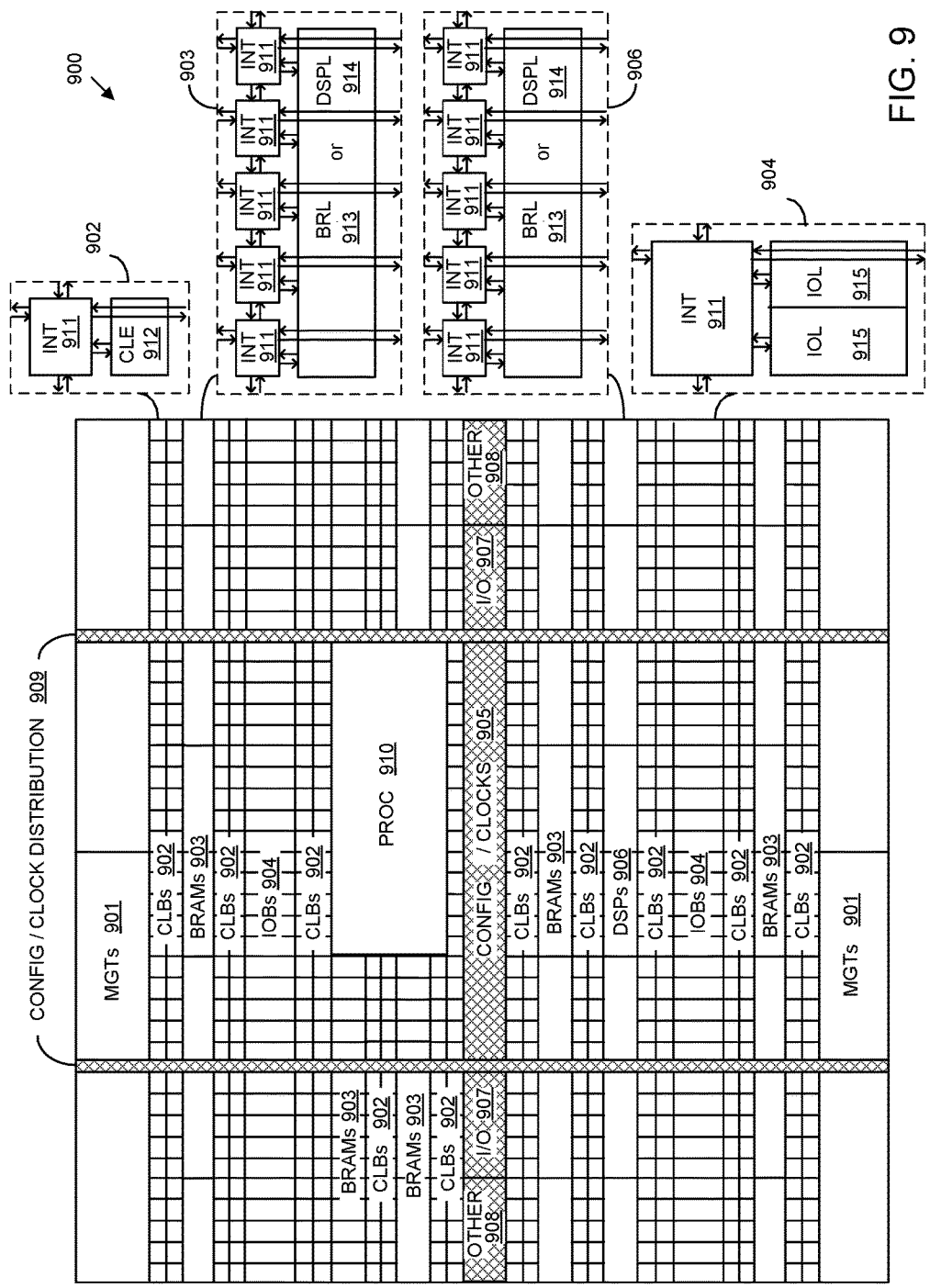
FIG. 9 is a block diagram illustrating an exemplary architecture for an integrated circuit.

FIG. 9 is a block diagram illustrating an exemplary architecture 900 for an IC. For example, architecture 900 may be used for a target IC in which the example circuit designs described herein may be implemented. In one aspect, architecture 900 may be implemented within a programmable IC. For example, architecture 900 may be used to implement an FPGA. Architecture 900 may also be representative of a system-on-chip (SOC) type of IC. An SOC is an IC that includes a processor that executes program code and one or more other circuits. The other circuits may be implemented as hardwired circuitry, programmable circuitry, and/or a combination thereof. The circuits may operate cooperatively with one another and/or with the processor.

As shown, architecture 900 includes several different types of programmable circuit, e.g., logic, blocks. For example, architecture 900 may include a large number of different programmable tiles including multi-gigabit transceivers (MGTs) 901, configurable logic blocks (CLBs) 902, random access memory blocks (BRAMs) 903, input/output blocks (IOBs) 904, configuration and clocking logic (CONFIG/CLOCKS) 905, digital signal processing blocks (DSPs) 906, specialized I/O blocks 907 (e.g., configuration ports and clock ports), and other programmable logic 908 such as digital clock managers, analog-to-digital converters, system monitoring logic, and so forth.

In some ICs, each programmable tile includes a programmable interconnect element (INT) 911 having standardized connections to and from a corresponding INT 911 in each adjacent tile. INTs 911, taken together, implement the programmable interconnect structure for the illustrated IC. Each INT 911 also includes the connections to and from the programmable logic element within the same tile, as shown by the examples included at the top of FIG. 9.

For example, a CLB 902 may include a configurable logic element (CLE) 912 that may be programmed to implement user logic plus a single INT 911. A BRAM 903 may include a BRAM logic element (BRL) 913 in addition to one or more INTs 911. Typically, the number of INTs 911 included in a tile depends on the height of the tile. As pictured, a BRAM tile has the same height as five CLBs, but other numbers (e.g., four) also may be used. A DSP tile 906 may include a DSP logic element (DSPL) 914 in addition to an appropriate number of INTs 911. An 10B 904 may include, for example, two instances of an I/O logic element (IOL) 915 in addition to one instance of an INT 911. The actual I/O pads connected to IOL 915 may not be confined to the area of IOL 915.

In the example pictured in FIG. 9, a columnar area near the center of the die, e.g., formed of regions 905, 907, and 908, may be used for configuration, clock, and other control logic. Horizontal areas 909 extending from this column may be used to distribute the clocks and configuration signals across the breadth of the programmable IC.

Some ICs utilizing the architecture illustrated in FIG. 9 include additional logic blocks that disrupt the regular columnar structure making up a large part of the IC. The additional logic blocks may be programmable blocks and/or dedicated circuitry. For example, a processor block depicted as PROC 910 spans several columns of CLBs and BRAMs.

In one aspect, PROC 910 may be implemented as dedicated circuitry, e.g., as a hardwired processor, that is fabricated as part of the die that implements the programmable circuitry of the IC. PROC 910 may represent any of a variety of different processor types and/or systems ranging in complexity from an individual processor, e.g., a single core capable of executing program code, to an entire processor system having one or more cores, modules, co-processors, interfaces, or the like.

In another aspect, PROC 910 may be omitted from architecture 900 and replaced with one or more of the other varieties of the programmable blocks described. Further, such blocks may be utilized to form a "soft processor" in that the various blocks of programmable circuitry may be used to form a processor that can execute program code as is the case with PROC 910.

The phrase "programmable circuitry" refers to programmable circuit elements within an IC, e.g., the various programmable or configurable circuit blocks or tiles described herein, as well as the interconnect circuitry that selectively couples the various circuit blocks, tiles, and/or elements according to configuration data that is loaded into the IC. For example, circuit blocks shown in FIG. 9 that are external to PROC 910 such as CLBs 902 and BRAMs 903 are considered programmable circuitry of the IC.

In general, the functionality of programmable circuitry is not established until configuration data is loaded into the IC. A set of configuration bits may be used to program programmable circuitry of an IC such as an FPGA. The configuration bit(s) typically are referred to as a "configuration bitstream." In general, programmable circuitry is not operational or functional without first loading a configuration bitstream into the IC. The configuration bitstream effectively implements a particular circuit design within the programmable circuitry. The circuit design specifies, for example, functional aspects of the programmable circuit blocks and physical connectivity among the various programmable circuit blocks. For example, a circuit design, as described herein, may be processed through a design flow (e.g., synthesis, placement, routing) to generate a configuration bitstream that may be loaded into the IC thereby physically implementing the circuit design within the IC.

Circuitry that is "hardwired" or "hardened," i.e., not programmable, is manufactured as part of the IC. Unlike programmable circuitry, hardwired circuitry or circuit blocks are not implemented after the manufacture of the IC through the loading of a configuration bitstream. Hardwired circuitry is generally considered to have dedicated circuit blocks and interconnects, for example, that are functional without first loading a configuration bitstream into the IC, e.g., PROC 910.

In some instances, hardwired circuitry may have one or more operational modes that can be set or selected according to register settings or values stored in one or more memory elements within the IC. The operational modes may be set, for example, through the loading of a configuration bitstream into the IC. Despite this ability, hardwired circuitry is not considered programmable circuitry as the hardwired circuitry is operable and has a particular function when manufactured as part of the IC.

In the case of an SOC, the configuration bitstream may specify the circuitry that is to be implemented within the programmable circuitry and the program code that is to be executed by PROC 910 or a soft processor. In some cases, architecture 900 includes a dedicated configuration processor that loads the configuration bitstream to the appropriate configuration memory and/or processor memory. The dedicated configuration processor does not execute user-specified program code. In other cases, architecture 900 may utilize PROC 910 to receive the configuration bitstream, load the configuration bitstream into appropriate configuration memory, and/or extract program code for execution.

FIG. 9 is intended to illustrate an exemplary architecture that may be used to implement an IC that includes programmable circuitry, e.g., a programmable fabric. For example, the number of logic blocks in a column, the relative width of the columns, the number and order of columns, the types of logic blocks included in the columns, the relative sizes of the logic blocks, and the interconnect/logic implementations included at the top of FIG. 9 are purely exemplary. In an actual IC, for example, more than one adjacent column of CLBs is typically included wherever the CLBs appear, to facilitate the efficient implementation of a user circuit design. The number of adjacent CLB columns, however, may vary with the overall size of the IC. Further, the size and/or positioning of blocks such as PROC 910 within the IC are for purposes of illustration only and are not intended as limitations.

For purposes of explanation, specific nomenclature is set forth to provide a thorough understanding of the various inventive concepts disclosed herein. The terminology used herein, however, is for the purpose of describing particular aspects of the inventive arrangements only and is not intended to be limiting.

As defined herein, the singular forms "a," "an," and "the" are intended to include the plural forms as well, unless the context clearly indicates otherwise. As defined herein, the term "another" means at least a second or more. As defined herein, the terms "at least one," "one or more," and "and/or," are open-ended expressions that are both conjunctive and disjunctive in operation unless explicitly stated otherwise. For example, each of the expressions "at least one of A, B and C," "at least one of A, B, or C," "one or more of A, B, and C," "one or more of A, B, or C," and "A, B, and/or C" means A alone, B alone, C alone, A and B together, A and C together, B and C together, or A, B and C together. As defined herein, the term "automatically" means without user intervention.

As defined herein, the term "computer readable storage medium" means a storage medium that contains or stores program code for use by or in connection with an instruction execution system, apparatus, or device. As defined herein, a "computer readable storage medium" is not a transitory, propagating signal per se. A computer readable storage medium may be, but is not limited to, an electronic storage device, a magnetic storage device, an optical storage device, an electromagnetic storage device, a semiconductor storage device, or any suitable combination of the foregoing. Memory elements, as described herein, are examples of a computer readable storage medium. A non-exhaustive list of more specific examples of a computer readable storage medium may include: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing.

As defined herein, the term "coupled" means connected, whether directly without any intervening elements or indirectly with one or more intervening elements, unless otherwise indicated. Two elements may be coupled mechanically, electrically, or communicatively linked through a communication channel, pathway, network, or system. As defined herein, the terms "includes," "including," "comprises," and/or "comprising," specify the presence of stated features, integers, steps, operations, elements, and/or components, but do not preclude the presence or addition of one or more other features, integers, steps, operations, elements, components, and/or groups thereof. As defined herein, the term "output" means storing in physical memory elements, e.g., devices, writing to display or other peripheral output device, sending or transmitting to another system, exporting, or the like. As defined herein, the term "plurality" means two or more than two.

As defined within this disclosure, the term "circuit design" means a description of a system specified in a hardware description language (HDL). A circuit design may refer to an entire circuit design that includes user specified HDL; one or more cores and/or intellectual properties (IPs); a combination of user specified HDL, cores, and/or IP; a single IP and/or core (e.g., a reusable portion of HDL); or the like. A circuit design may include one or more modules. As defined within this disclosure, the term "module" means a unit of HDL. A module is a defined construct within the syntax of the particular HDL that is being used and is part of a hierarchical organization of modules forming the circuit design.

As defined herein, the term "hardware description language" is a computer-language that facilitates the documentation, design, and manufacturing of a digital system, such as an integrated circuit. A hardware description language, or HDL, combines program verification techniques with expert system design methodologies. Using an HDL, for example, a user can design and specify an electronic circuit, describe the operation of the circuit, and create tests to verify operation of the circuit. An HDL includes standard, text-based expressions of the spatial and temporal structure and behavior of the electronic system being modeled. HDL syntax and semantics include explicit notations for expressing concurrency. In contrast to most high level programming languages, an HDL also includes an explicit notion of time, which is a primary attribute of a digital system. Examples of HDL include VHDL, Verilog, register transfer level (RTL) descriptions, behavioral descriptions of a digital system, a netlist, etc.

As defined herein, the term "if" means "when" or "upon" or "in response to" or "responsive to," depending upon the context. Thus, the phrase "if it is determined" or "if [a stated condition or event] is detected" may be construed to mean "upon determining" or "in response to determining" or "upon detecting [the stated condition or event]" or "in response to detecting [the stated condition or event]" or "responsive to detecting [the stated condition or event]" depending on the context. As defined herein, the term "responsive to" means responding or reacting readily to an action or event. Thus, if a second action is performed "responsive to" a first action, there is a causal relationship between an occurrence of the first action and an occurrence of the second action. The term "responsive to" indicates the causal relationship.

As defined herein, the terms "one embodiment," "an embodiment," or similar language mean that a particular feature, structure, or characteristic described in connection with the embodiment is included in at least one embodiment described within this disclosure. Thus, appearances of the phrases "in one embodiment," "in an embodiment," and similar language throughout this disclosure may, but do not necessarily, all refer to the same embodiment. The terms "arrangement" and "embodiment" may be used interchangeably within this disclosure.

As defined herein, the term "processor" means at least one hardware circuit configured to carry out instructions contained in program code. The hardware circuit may be an integrated circuit. Examples of a processor include, but are not limited to, a central processing unit (CPU), an array processor, a vector processor, a digital signal processor (DSP), a field-programmable gate array (FPGA), a programmable logic array (PLA), an application specific integrated circuit (ASIC), programmable logic circuitry, a graphics processing unit (GPU), a controller, and so forth.

As defined herein, the term "real time" means a level of processing responsiveness that a user or system senses as sufficiently immediate for a particular process or determination to be made, or that enables the processor to keep up with some external process. As defined herein, the term "user" means a human being. The terms first, second, etc. may be used herein to describe various elements. These elements should not be limited by these terms, as these terms are only used to distinguish one element from another unless stated otherwise or the context clearly indicates otherwise.

A computer program product may include a computer readable storage medium (or media) having computer readable program instructions thereon for causing a processor to carry out aspects of the inventive arrangements described herein. Within this disclosure, the term "program code" is used interchangeably with the term "computer readable program instructions." Computer readable program instructions described herein may be downloaded to respective computing/processing devices from a computer readable storage medium or to an external computer or external storage device via a network, for example, the Internet, a LAN, a WAN and/or a wireless network. The network may include copper transmission cables, optical transmission fibers, wireless transmission, routers, firewalls, switches, gateway computers and/or edge devices including edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations for the inventive arrangements described herein may be assembler instructions, instruction-set-architecture (ISA) instructions, machine instructions, machine dependent instructions, microcode, firmware instructions, or either source code or object code written in any combination of one or more programming languages, including an object oriented programming language and/or procedural programming languages. Computer readable program instructions may include state-setting data. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a LAN or a WAN, or the connection may be made to an external computer (for example, through the Internet using an Internet Service Provider). In some cases, electronic circuitry including, for example, programmable logic circuitry, an FPGA, or a PLA may execute the computer readable program instructions by utilizing state information of the computer readable program instructions to personalize the electronic circuitry, in order to perform aspects of the inventive arrangements described herein.

Certain aspects of the inventive arrangements are described herein with reference to flowchart illustrations and/or block diagrams of methods, apparatus (systems), and computer program products. It will be understood that each block of the flowchart illustrations and/or block diagrams, and combinations of blocks in the flowchart illustrations and/or block diagrams, may be implemented by computer readable program instructions, e.g., program code.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the operations specified in the flowchart and/or block diagram block or blocks.

The computer readable program instructions may also be loaded onto a computer, other programmable data processing apparatus, or other device to cause a series of operations to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various aspects of the inventive arrangements. In this regard, each block in the flowchart or block diagrams may represent a module, segment, or portion of instructions, which comprises one or more executable instructions for implementing the specified operations.

In some alternative implementations, the operations noted in the blocks may occur out of the order noted in the figures. For example, two blocks shown in succession may be executed substantially concurrently, or the blocks may sometimes be executed in the reverse order, depending upon the functionality involved. In other examples, blocks may be performed generally in increasing numeric order while in still other examples, one or more blocks may be performed in varying order with the results being stored and utilized in subsequent or other blocks that do not immediately follow. It will also be noted that each block of the block diagrams and/or flowchart illustration, and combinations of blocks in the block diagrams and/or flowchart illustration, may be implemented by special purpose hardware-based systems that perform the specified functions or acts or carry out combinations of special purpose hardware and computer instructions.

The corresponding structures, materials, acts, and equivalents of all means or step plus function elements that may be found in the claims below are intended to include any structure, material, or act for performing the function in combination with other claimed elements as specifically claimed.

A method of circuit design implementation using controls sets can include selecting, using a processor, a first load and a second load each having a control pin of a same type driven by a different driver, determining, using the processor, that the driver of the first load matches the driver of the second load, and responsive to the determining, modifying the circuit design, using the processor, to drive the control pins of the first load and the second load using the driver of the first load.

The determining that the driver of the first load matches the driver of the second load can include determining that the driver of the first load and the driver of the second load are of a same type of circuit component and determining that input connectivity of the driver of the first load matches the input connectivity of the driver of the second load.

The modifying the circuit design can include removing the driver of the first load from the circuit design.

The modifying the circuit design can include disconnecting the control pin of the first load from the driver of the first load, removing the driver of the first load from the circuit design, and connecting the control pin of the first load to the driver of the second load.

The determining that the driver of the first load matches the driver of the second load can include determining that neither the driver of the first load nor the driver of the second load is associated with a constraint.

The method can include, responsive to determining that an upstream pair of drivers for the first load and the second load match, performing a driver merge operation on the upstream pair of drivers.

The method can include, performing the determining whether the driver of the first load matches the driver of the second load and the modifying the circuit design for different control pins of the first load and the second load of a different control pin type.

The determining that the driver of the first load matches the driver of the second load can include determining that the driver of the first load and the driver of the second load are assigned to a same group based upon timing information.

The method can include first forming a group of loads having same types of control pins where the control pins are driven by different drivers, wherein the first load and the second load are selected from the group. In one aspect, the selecting, the determining, and the modifying are performed for each pair of loads of the group.

A method of circuit design implementation using module-based replication can include selecting, using a processor, a net having a driver and a plurality of loads exceeding a high fan-out net threshold, determining, using the processor, a selected module of the circuit design having a number of the plurality of loads of the net that meet a cloning criteria, and, responsive to the determining, modifying, using the processor, the circuit design by creating a clone of the driver within the selected module and driving the loads of the net within the selected module with the clone of the driver.

The modifying the circuit design can include disconnecting each of the loads of the net within the selected module from the driver and connecting each of the loads of the net within the selected module to the clone of the driver.

The cloning criteria can include a lower threshold number of loads of the selected module. In one aspect, the selected module is a lowest level module of the circuit design.

The cloning criteria can include an upper threshold number of loads of the selected module that is less than the high fan-out net threshold.

The method can include identifying a plurality of modules of the circuit design that collectively have a number of loads of the net that meets the cloning criteria and using the identified plurality of modules as the selected module, wherein the clone of the driver drives the loads of the plurality of modules.

The method can include comparing an original count of loads of the net with a sum of loads driven by the driver of the net and loads driven by each clone of the driver to perform verification.

The method can include grouping the loads of the selected module into a plurality of groups based upon timing. The modifying the circuit design can create one clone of the driver for each group of the plurality of groups in the selected module and drives the loads in the respective group. In one aspect, a first group of the plurality of groups and a second group of the plurality of groups are timing constrained to different degrees. The grouping may be performed based on slack.

One or more other embodiments include a system. The system includes a processor configured to initiate the various executable operations and/or methods described within this disclosure.

One or more other embodiments include a computer program product including a computer readable storage medium having program code stored thereon. The program code is executable by a processor to perform operations and/or methods as described within this disclosure.

The description of the inventive arrangements provided herein is for purposes of illustration and is not intended to be exhaustive or limited to the form and examples disclosed. The terminology used herein was chosen to explain the principles of the inventive arrangements, the practical application or technical improvement over technologies found in the marketplace, and/or to enable others of ordinary skill in the art to understand the inventive arrangements disclosed herein. Modifications and variations may be apparent to those of ordinary skill in the art without departing from the scope and spirit of the described inventive arrangements. Accordingly, reference should be made to the following claims, rather than to the foregoing disclosure, as indicating the scope of such features and implementations.

What is claimed is:

1. A method of circuit design implementation using controls sets, comprising:
   selecting, using a processor, a first load and a second load each having a control pin of a same type driven by a different driver, wherein the control pins receive control signals that are distinct from data signals received by the first load and the second load;
   determining, using the processor, that the driver of the first load matches the driver of the second load; and
   responsive to the determining, modifying the circuit design, using the processor, to drive the control pins of the first load and the second load using the driver of the first load;
   wherein the modified circuit design is implemented within an integrated circuit device.

2. The method of claim 1, wherein the determining that the driver of the first load matches the driver of the second load comprises:
   determining that the driver of the first load and the driver of the second load are of a same type of circuit component; and
   determining that input connectivity of the driver of the first load matches the input connectivity of the driver of the second load.

3. The method of claim 1, wherein the modifying the circuit design comprises:
   removing the driver of the first load from the circuit design.

4. The method of claim 1, wherein the modifying the circuit design comprises:
   disconnecting the control pin of the first load from the driver of the first load;
   removing the driver of the first load from the circuit design; and
   connecting the control pin of the first load to the driver of the second load.

5. The method of claim 1, wherein the determining that the driver of the first load matches the driver of the second load comprises:
   determining that neither the driver of the first load nor the driver of the second load is associated with a constraint.

6. The method of claim 1, further comprising:
   responsive to determining that an upstream pair of drivers for the first load and the second load match, performing a driver merge operation on the upstream pair of drivers.

7. The method of claim 1, further comprising:
   performing the determining whether the driver of the first load matches the driver of the second load and the modifying the circuit design for different control pins of the first load and the second load of a different control pin type.

8. The method of claim 1, wherein the determining that the driver of the first load matches the driver of the second load comprises:
   determining that the driver of the first load and the driver of the second load are assigned to a same group based upon timing information.

9. The method of claim 1, further comprising:
   first forming a group of loads having same types of control pins where the control pins are driven by different drivers, wherein the first load and the second load are selected from the group.

10. The method of claim 9, wherein the selecting, the determining, and the modifying are performed for each pair of loads of the group.

11. A method of circuit design implementation using module-based replication, comprising:
    selecting, using a processor, a net having a driver and a plurality of loads exceeding a high fan-out net threshold;
    determining, using the processor, a selected module of the circuit design having a number of the plurality of loads of the net that meets at least one cloning criterion;
    grouping the loads of the selected module into a plurality of groups based on timing; and
    responsive to the determining and grouping, modifying, using the processor, the circuit design by creating one clone of the driver for each group of the plurality of groups in the selected module of the circuit design, wherein each clone drives the loads in the group corresponding to the clone;
    wherein the modified circuit design is implemented within an integrated circuit device.

12. The method of claim 11, wherein the modifying the circuit design comprises:
    disconnecting each of the loads of the net within the selected module from the driver; and
    connecting each of the loads of the net within the selected module to the corresponding clones of the driver.

13. The method of claim 11, wherein the at least one cloning criterion includes a lower threshold number of loads of the selected module.

14. The method of claim 13, wherein the selected module is a lowest level module of the circuit design.

15. The method of claim 13, wherein the at least one cloning criterion includes an upper threshold number of loads of the selected module that is less than the high fan-out net threshold.

16. The method of claim 11, further comprising:
    identifying a plurality of modules of the circuit design that collectively have a number of loads of the net that meets the at least one cloning criterion and using the identified plurality of modules as the selected module, wherein the clone of the driver drives the loads of the plurality of modules.

17. The method of claim 11, further comprising:
comparing an original count of loads of the net with a sum of loads driven by the driver of the net and loads driven by each clone of the driver to perform verification.

18. The method of claim 11, wherein a first group of the plurality of groups and a second group of the plurality of groups are timing constrained to different degrees.

19. The method of claim 11, wherein the grouping is performed based on slack.

* * * * *